United States Patent [19]
Einset

[11] Patent Number: 5,525,815
[45] Date of Patent: Jun. 11, 1996

[54] DIAMOND FILM STRUCTURE WITH HIGH THERMAL CONDUCTIVITY

[75] Inventor: Erik O. Einset, Niskayuna, N.Y.

[73] Assignee: General Electric Company, Schenectady, N.Y.

[21] Appl. No.: 316,998

[22] Filed: Oct. 3, 1994

[51] Int. Cl.⁶ ............... H01L 31/0312; H01L 23/34
[52] U.S. Cl. ............ 257/77; 257/712; 423/446; 428/212; 428/408
[58] Field of Search ............ 257/77, 712; 428/408; 427/212, 249; 423/446

[56] References Cited

U.S. PATENT DOCUMENTS

| | | | |
|---|---|---|---|
| 5,126,206 | 6/1992 | Garg et al. | 428/408 |
| 5,147,687 | 9/1992 | Garg et al. | 427/249 |
| 5,273,731 | 12/1993 | Anthony et al. | 423/446 |
| 5,310,596 | 5/1994 | Bigelow et al. | 428/212 |

FOREIGN PATENT DOCUMENTS

| | | | |
|---|---|---|---|
| 0449571A | 3/1991 | European Pat. Off. | 427/249 |
| WO9325725 | 6/1992 | Germany | 427/249 |

OTHER PUBLICATIONS

J. Doting, Isotherms In Diamond Heat Sinks, Non–Linear Heat Transfer In An Excellent Heat Conductor, CH2530–4/88/0000–0113 (1988) IEEE, pp. 113–117.

G. K. Reeves, et al., Temperature Distriction in GaAs Lasers with Diamond Film Heatsink, Electronics Letters, vol. 28, No. 25, (Dec. 3, 1992) pp. 2317–2318.

M. Seal, Thermal and Optical Applications of Thin Film Diamond, Phil. Trans. R. Soc. Lond. A (1993) 342, pp. 313–321.

*Primary Examiner*—Steven H. Loke
*Attorney, Agent, or Firm*—Noreen C. Johnson; William H. Pittman

[57] ABSTRACT

A continuous diamond structure deposited by chemical vapor deposition is disclosed having at least two thermal conductivity diamond layers controlled by the diamond growth rate where one thermal conductivity diamond layer is grown at a high growth rate of at least one micron per hour for hot filament chemical vapor deposition and at least 2–3 microns per hour for microwave plasma assisted chemical vapor deposition, on a substrate such as molybdenum in a chemical vapor deposition chamber and at a substrate temperature that promotes the high growth rate, and the other thermal conductivity diamond layer is grown at a growth rate and substrate temperature lower than the high growth rate diamond layer. High growth rate and low growth rate diamond layers can be deposited in any sequence to obtain a continuous diamond structure that does not show distinguishable, separate, crystalline columnar layers, having improved thermal conductivity.

5 Claims, 4 Drawing Sheets

DIAMOND FILM STRUCTURE WITH HIGH THERMAL CONDUCTIVITY

This application is related to the following copending application which is commonly assigned: E. O. Einset, "Method for Making High Thermal Conducting Diamond," U.S. application Ser. No. 08/316,995 (attorney docket number RD-22,976).

FIELD OF THE INVENTION

The present invention relates to a continuous diamond film structure with at least two controlled thermal conducting layers, and particularly, to a polycrystalline diamond film having improved overall thermal conductivity.

BACKGROUND OF THE INVENTION

As a result of the tightly packed atoms and strong bonds of the diamond lattice, diamond is the best conductor of heat known at ambient temperatures with high thermal conductivity. Of the many uses of diamond where its high thermal conductivity plays a role, the use as a heat sink, is probably the one which depends most directly on this property.

Polycrystalline diamond formed by chemical vapor deposition, herein sometimes called CVD diamond, offers the best potential as a heat sink. However, presently the thermal conductivity of CVD diamond differs from that of natural diamond in that it may vary through the thickness of a sample and is anisotropic. As discussed by M. Seal in the article, *Thermal and Optical Applications of Thin Film Diamond*, PHIL. TRANS R. SOC. LOND A (1993) pages 313–322, polycrystalline CVD diamond films show an anisotropy of thermal conductivity between directions parallel to (lateral) and perpendicular to the diamond film plane. The thermal conductivity measured perpendicular to the plane was found to be at least 50% higher than that parallel to the plane. The conductivity has been found to vary inversely with the growth rate and Raman line width. Since the diamond layers are heat spreaders, it is the parallel or lateral conductivity which is limiting.

It would be desirable to have synthetic diamond films with a structure that promotes high parallel and perpendicular thermal conductivity. It is further desirable to have a free-standing, polycrystalline diamond film that spreads large amounts of heat laterally at the surface that is used for mounting extremely closely packed electronic components. Likewise, it would be desirable to have a synthetic diamond heat sink that quickly dissipates heat generated by arrays of laser diodes.

SUMMARY OF THE INVENTION

In accordance with this invention, a continuous polycrystalline diamond film is grown by chemical vapor deposition methods where the diamond structure has at least two controlled thermal conductivity layers. One controlled thermal conductivity layer, with diamond crystals having columnar structure, is grown at a high growth rate on a substrate, such as molybdenum, at a substrate temperature that promotes the high growth rate, herein referred to as Layer A. The result is diamond with high thermal conductivity in the direction perpendicular to the diamond film plane. Raman spectra for the first controlled thermal conductivity layer shows FWHM values (full width at half maximum height) greater than about 7/centimeters ($cm^{-1}$).

The other thermal conductivity layer, herein Layer B, is grown at a lower growth rate and substrate temperature than Layer A. Layer B has high thermal conductivity in both the parallel and perpendicular directions to the diamond film plane, having FWHM values up to about 7 $cm^{-1}$, based on Raman spectra. The thickness of Layer B is generally twenty percent or less the thickness of Layer A.

The overall diamond structure is continuous and does not show distinguishable, separate, crystalline columnar layers. Each layer is grown on top of the preceding layer so that the diamond structure is grown without interrupting the columnar structure of the diamond crystals. The layers are differentiated only by thermal conductivity measurements and corresponding FWHM's shown by Raman spectra.

The layers can be deposited in any pattern, so long as there is at least one Layer A and one Layer B. Multiple controlled thermal conductivity layers can be deposited or only two such layers. For instance, Layer A may be deposited first, followed by Layer B. Reversing the sequence, the structure of the invention also encompasses depositing Layer B first, followed by layer A. Either Layer A or Layer B may be the final layer deposited depending on the application for the diamond.

The diamond structure of the present invention may have more than two layers by depositing them sequentially in a cycle. As an example, the cycle may be Layer A, Layer B, and Layer A, or Layer B, Layer A, Layer B, Layer A, or Layer A, Layer A, Layer B.

The present invention is directed to CVD polycrystalline diamond structures with improved overall thermal conductivity. By having at least two controlled thermal conductivity layers, the lateral heat spreading ability of the diamond is increased. This enables the diamond to be utilized in many applications requiring quick dissipation of heat.

BRIEF DESCRIPTION OF THE DRAWINGS

FIG. 2 shows a temperature profile for a corner of the CVD diamond film in FIG. 1a.

DETAILED DESCRIPTION OF THE INVENTION

Figure 1:
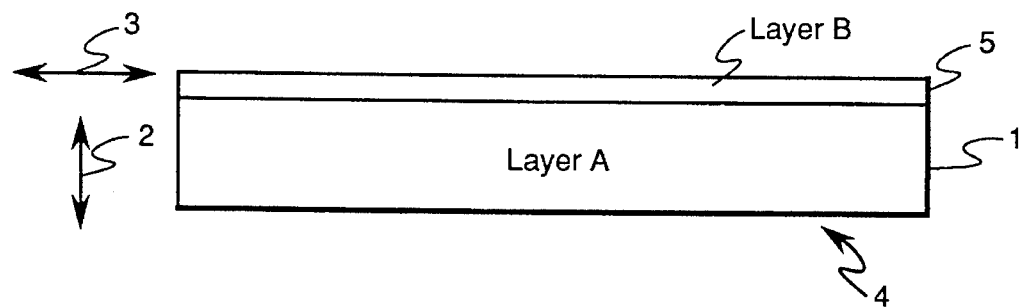
FIGS. 1 and 1a show the continuous diamond film having at least two controlled thermal conductivity layers. Layer A is grown at a higher growth rate than layer B.

The overall thermal conductivity of the continuous diamond film is increased by depositing at least two controlled thermal conductivity layers. One layer (Layer A) is deposited at a high growth rate and corresponding substrate temperature and has high thermal conductivity in the direction perpendicular to the diamond film plane. A second layer (Layer B) is deposited at a lower growth rate and substrate temperature than Layer A and has high thermal conductivity in the directions parallel and perpendicular to the diamond film plane.

By "controlled thermal conductivity layer" is meant a layer of CVD diamond deposited under controlled parameters, such as growth rate and substrate temperature, in order to achieve a specified thermal conductivity in the diamond layer. The term "diamond film" may mean an article of any shape and thickness that is deposited by a chemical vapor deposition process for diamond. The term "diamond film plane" means the same plane as the surface of the substrate that the diamond is deposited on during chemical vapor deposition.

The diamond structure of the present invention may be made by any known process for the chemical vapor deposition of diamond on a substrate. Such chemical vapor deposition processes include, but are not limited to, hot filament (HFCVD), microwave plasma assisted, plasma torch, and direct current arc plasma. The description of the invention referring to one type of chemical vapor deposition process which follows is representative of the present invention using other types of conventional CVD processes.

One type of diamond deposition process that can be used to make the continuous diamond structure of this invention is hot filament chemical vapor deposition, sometimes called HFCVD. The process is contemplated for use, and is described merely to impart an understanding of the present invention.

Briefly, the HFCVD process takes place in an enclosed apparatus in a reaction chamber which is air-tight, capable of being maintained at reduced pressure, and is fitted with a suitable gas inlet and an exhaust port. All portions of the apparatus which are present in the reaction chamber are constructed of suitable heat-resistant materials, as necessary to withstand filament temperatures on the order of about 2000° C. and substrate temperatures up to about 1000° C. Quartz is an illustrative non-conductive heat-resistant material suitable for this purpose.

Features of the apparatus include a substrate, generally molybdenum or other suitable material, which may have a planar or curved diamond deposition surface, but is not limited to such. The substrate is maintained in position at a suitable spacing from a resistance heating means for deposition to take place.

The resistance heating means comprise two electrodes and a one or more vertically extending linear, electrically conductive filaments or wires, herein called filaments, and otherwise being of conventional design and circuitry. The material of which said filaments are comprised is not critical, any material known in the art as suitable for this purpose being acceptable. Illustrative materials are metallic tungsten, tantalum, molybdenum, and rhenium. Filament diameters of about 0.2–1.0 mm. are typical. The filaments are located parallel to the substrate. Distances from filaments to substrate are generally on the order of 5–10 mm.

It is highly desirable to maintain substrates at temperatures in the range of about 700°–1000° C., with a range of about 850°–1000° C. for high growth rate layers and a range of about 700°–850° C. for low growth rate layers. The desired temperature control is achieved by a substrate cooling means comprising a heat sink. The substrate is positioned between the heat sink and the filament. The heat sink is typically made of metallic copper and cooled by attached serpentine tubing fitted with a cooling water inlet and outlet respectively. The substrate temperature is kept by auxiliary heaters, by hot filament power, or by a heating means as disclosed in copending and commonly assigned U.S. patent application Ser. No. 08/172,797, filed Dec. 27, 1993.

In operation, the reaction chamber of the apparatus is maintained at a pressure up to about 760 torr, typically on the order of 10 torr. A mixture of hydrogen and a hydrocarbon, most often methane and generally present in an amount up to about 2% by volume based on total gas, is passed into the chamber and a current is passed through the electrodes and filaments to heat the filaments to a temperature of at least about 2000° C.

The substrate temperature is kept in the range of about 700°–1000° C., preferably at about 850°–1000° C. for the first layer of diamond deposited at a high growth rate and at about 750°–850° C. for the second layer of diamond deposited at a low growth rate, and most preferably at about 900°–960° C. for high growth rate deposition of diamond and about 800° C. for the low growth rate deposition of diamond.

In the practice of this invention the thickness of the layers is determined by the application for the diamond film. Layer A is up to about fifty times as thick as Layer B, or Layer B is up to about 20 percent as thick as Layer A. For instance, if the diamond film is to be used as a heat sink, the total thickness might be 0.50 millimeters, with Layer A being thickest (0.40–0.50 mm) and the Layer B being the thin layer (0.01–0.10 mm). Likewise, Layers A and B can be deposited in any continuous order until the desired thickness is achieved.

The overall time to grow the diamond film is dependent on the growth rate chosen for each layer and the total desired thickness of the diamond film. Layer A is deposited at a high growth rate for the CVD process utilized. For instance, for HFCVD a high growth rate is generally at least one micron per hour. Layer B is deposited at a low growth rate, determined by the CVD process used. The result is high thermal conductivity, generally at least 1000 W/m K, in the direction parallel to the film plane in Layer B. If this layer is also the top layer of the diamond film, it serves to dissipate and spread laterally the heat generated at its top surface.

EXAMPLES

To demonstrate the present invention, referring to FIG. 1, there is shown a schematic diagram of a layered thermal conductivity continuous diamond film. Layer A 1 is grown at a high growth rate, about one micron per hour for hot filament CVD and about 3–5 microns per hour for microwave plasma CVD. Layer A's thermal conductivity in the direction parallel 3 to the diamond film plane 4 is low, about 300 W/m K. However, Layer A 1 has a high thermal conductivity in the direction perpendicular 2 to the diamond film plane 4, about 1000 W/m K. Layer B 5 is grown at a low growth rate, about less than one micron per hour for hot filament CVD and 1.0–2.0 microns per hour for microwave plasma CVD. Layer B 5 has high thermal conductivity in the direction parallel 3 to the film plane 4.

Figure 1A:
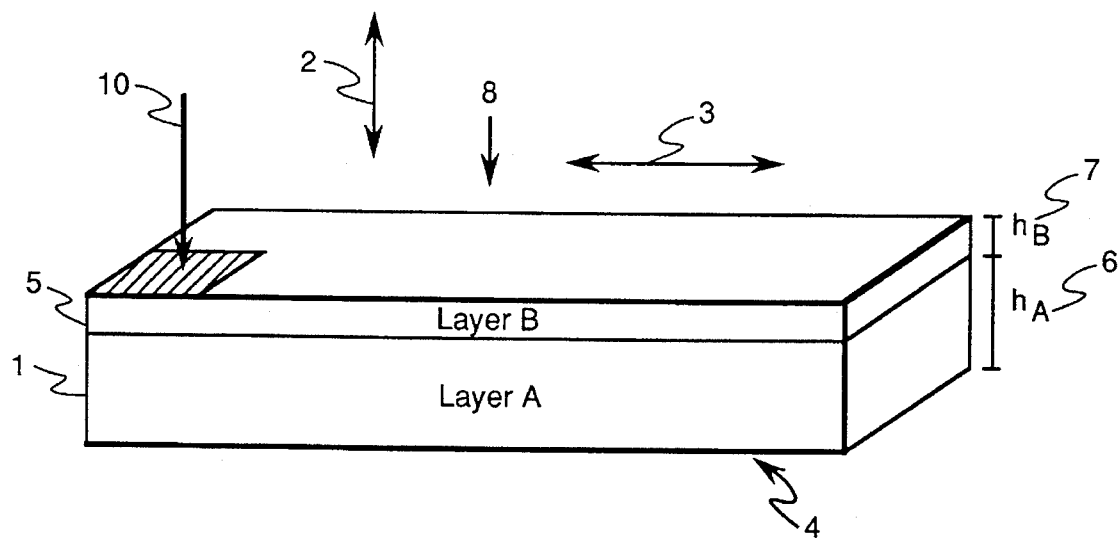

FIG. 1a shows a pictorial of a continuous diamond film consisting of two controlled thermal conductivity diamond layers, Layer A 1 and Layer B 5. Layer A 1 with thickness $h_A$ 6 has thermal conductivity in the parallel direction 3 to the film plane 4 of 300 W/m K and a thermal conductivity in the perpendicular direction 2 of 1000 W/m K. Layer B 5 with thickness $h_B$ 7 has parallel and perpendicular thermal conductivities of about 1000 W/m K. For hot filament CVD, Layer A I is grown at one micron per hour and Layer B 5 is grown at 0.3 microns per hour. The total time to deposit 0.50 millimeters(mm) of diamond film is shown in Table 1 for various layer thicknesses. Table 1 also gives peak temperatures at the top surface 8 of Layer B 5 during operation of the diamond film as a heat sink. By varying the thicknesses of Layers A 1 and B 5, it is shown that a significant savings in growth time can be obtained.

TABLE 1

Calculated Peak Temperatures at Top Surface of Layer B and Total Growth Times for Continuous Diamond Film by HFCVD.

| Layer A Time $h_A$ (1 µ/hr) | Layer B $h_B$ (0.3 µ/hr) | Peak Temperature °C. | Growth Days |
|---|---|---|---|
| 0.00 mm | 0.50 mm | 69.9° C. | 69.4 |
| 0.48 mm | 0.02 mm | 87.2° C. | 22.8 |
| 0.45 mm | 0.05 mm | 78.6° C. | 23.6 |
| 0.40 mm | 0.10 mm | 73.5° C. | 30.5 |

Figure 2:
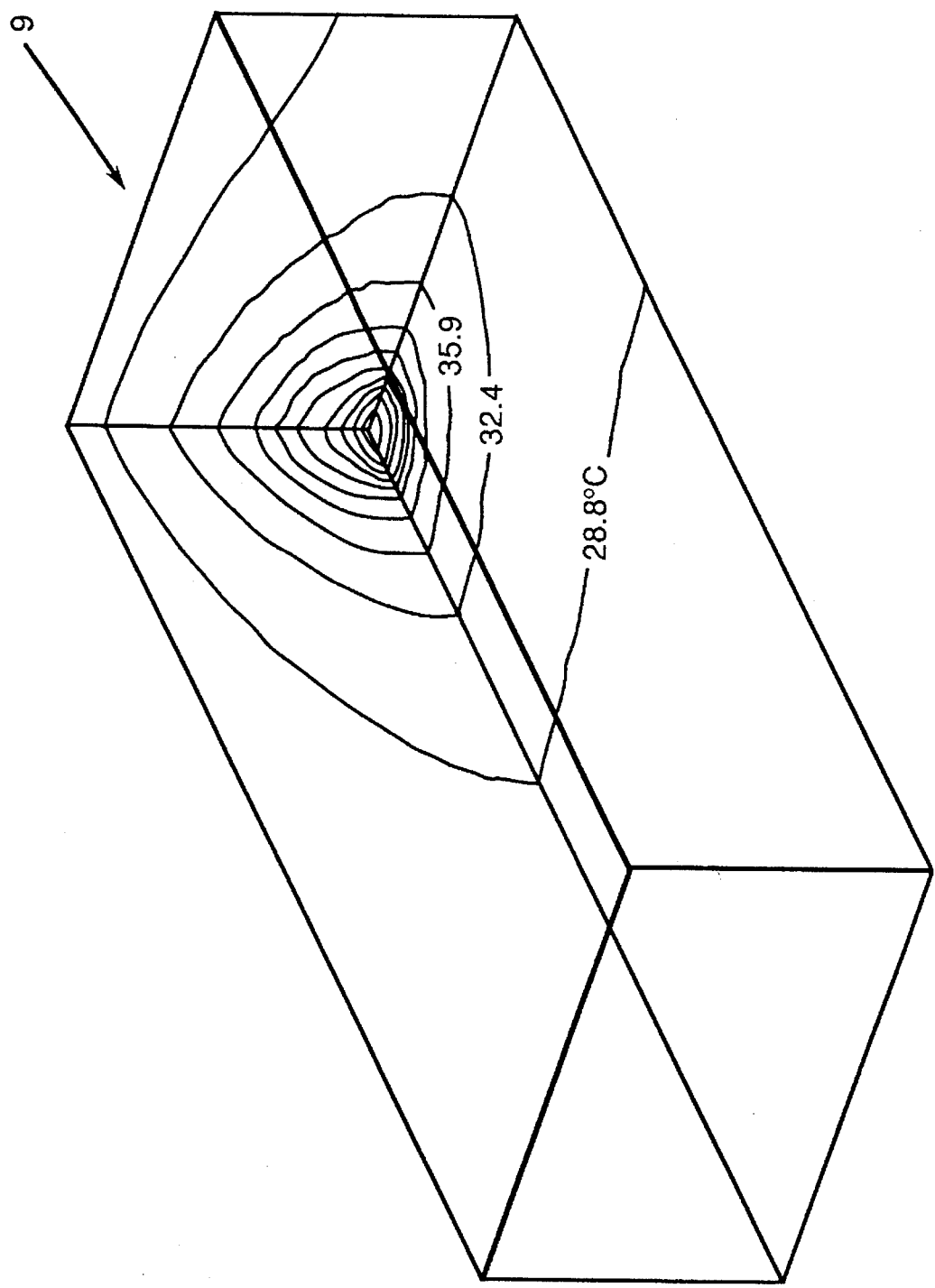

Now referring to FIG. 2, there is represented a temperature profile 9 of a plotted isotherm of CVD diamond for $h_A$ 6 (FIG. 1a) equals 0.40 mm and $h_B$ 7 (FIG. 1a) equals 0.10 mm. The diamond film measures 2.0 mm long, 0.8 mm wide, and 0.5 mm thick. A heat flux of 4.2 Watts impinges over an area of 0.1 mm by 0.1 mm in the corner of the diamond 10 (see FIG. 1a). It is demonstrated that the temperature rise in the diamond is 46.5° C. The base of the diamond is maintained at a constant temperature of 27° C. and the peak temperature is 73.5° C.

Figure 3:
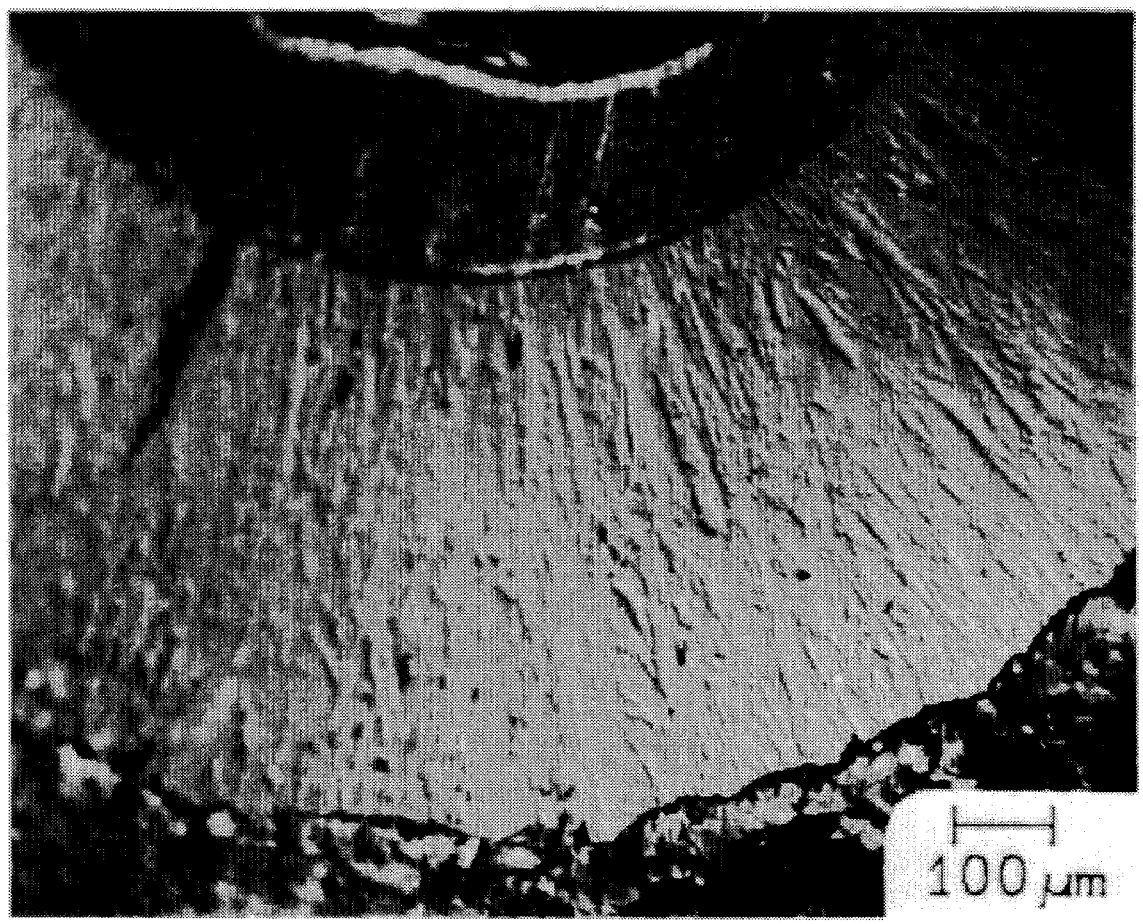
FIG. 3 is a photo of hot filament chemical vapor deposited continuous diamond film with at least two controlled thermal conductivity layers in accordance with this invention.

FIG. 3 is a photo of continuous diamond film of this invention. It shows the uninterrupted columnar structure of the diamond film. The diamond was grown on a hollow cylindrical mandrel using one filament in a hot filament CVD process. The hot filament was kept at a temperature around 2000° C. by applying 398 watts to it. The substrate temperature was independently controlled by passing current through the cylindrical mandrel. The total gas flow rate was 400 sccm and consisted of 1% methane in 99% hydrogen ($H_2$) at a pressure of 10 Torr. The growth rate was measured by measuring the change in mandrel radius with a video microscope. A thermocouple inserted in the hollow mandrel substrate monitored the temperature. During the total growth process, the substrate temperature was varied from 800° C. to 960° C. After growth, the sample was sectioned and polished, and a cross-section was analyzed by scanning micro-Raman analysis. The Raman peak changed as the growth conditions changed in the radial dimension of the diamond as shown in Table 2.

TABLE 2

Raman Peak Height as Function of Substrate Temperature

| Substrate Temp. | Growth Rate | Raman Peak Height |
|---|---|---|
| 800° C. | 0.65 microns/hour | 1350 |
| 900° C. | 1.14 microns/hour | 700 |
| 960° C. | 1.44 microns/hour | 500 |

Figure 4:
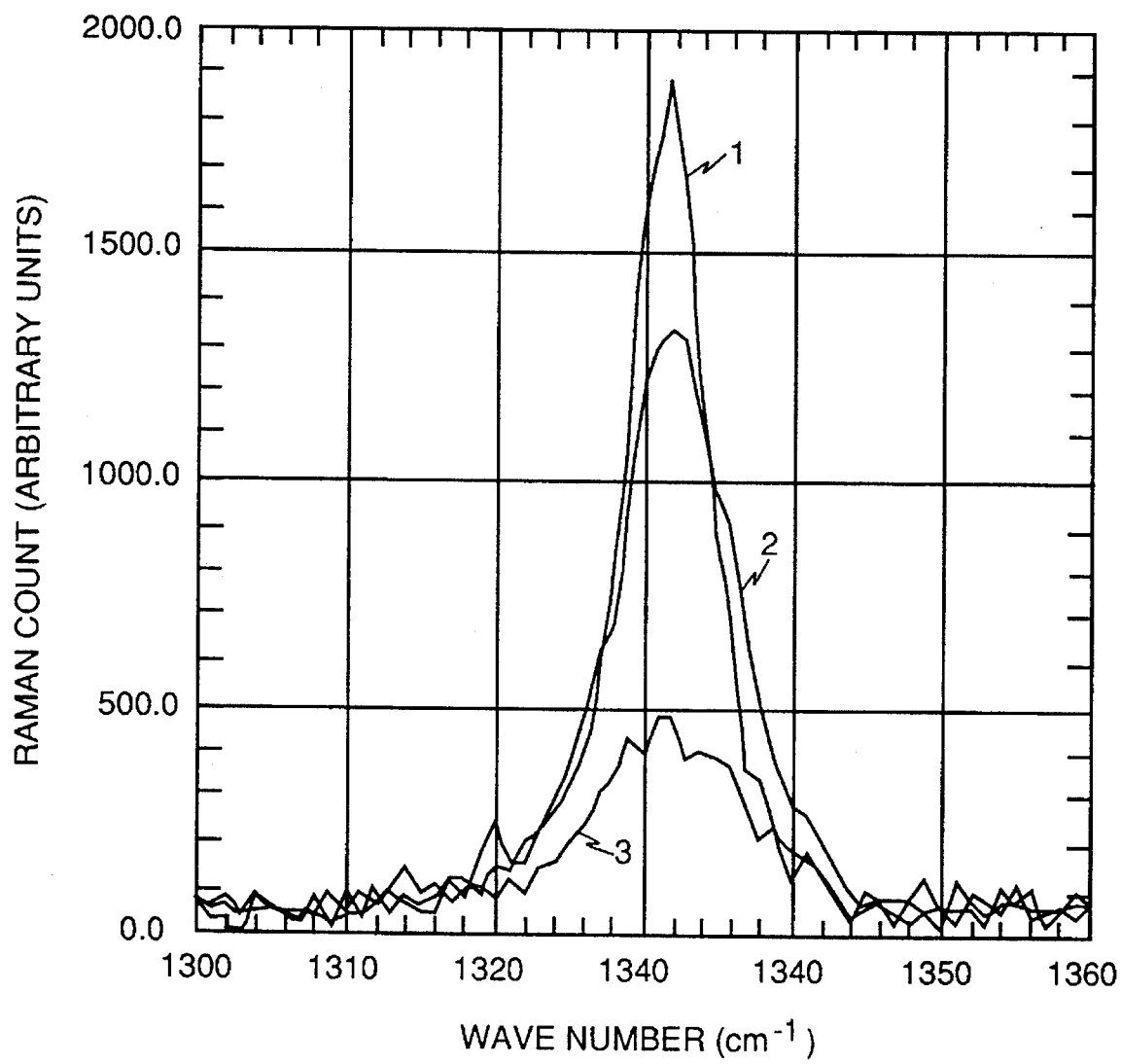
FIG. 4 is a graph showing the Raman spectra for the HFCVD diamond of FIG. 3.

The thermal conductivity layers are distinguishable by Raman spectra, as shown by FIG. 4. The highest peak 1, corresponds to Layer B of the controlled thermal conducting layer of the continuous diamond film. Peaks 2 and 3 correspond to Layer A.

What is claimed is:

1. A continuous free-standing diamond film having an uninterrupted columnar structure of diamond crystals deposited by chemical vapor deposition having at least two thermal conductivity diamond layers, said diamond film comprising: a thermal conducting diamond layer A having thermal conductivity in a direction perpendicular to a diamond film plane greater than thermal conductivity in a direction parallel to the diamond film plane, and a thermal conducting diamond layer B having thermal conductivity in the direction perpendicular to the diamond film plane equal to thermal conductivity in the direction parallel to the diamond film plane, with thermal conductivity in diamond layer A and diamond layer B respectively controlled by a different diamond growth rate and a different chemical vapor deposition substrate temperature, where diamond layer A is deposited at the diamond growth rate and substrate temperature greater than the diamond growth rate and substrate temperature used to deposit diamond layer B, wherein the substrate temperature for depositing diamond layer A is between 900°–1000° C. and the substrate temperature for depositing diamond layer B is between 700°–850° C., said substrate temperature being a temperature of a substrate in a chemical vapor deposition chamber used as a surface for depositing the diamond film, and said diamond film plane being the same plane as a surface of the substrate that said diamond film is deposited on in the chemical vapor deposition chamber, and diamond layer A being up to fifty times as thick as diamond layer B and diamond layer B being up to twenty percent as thick as diamond layer A.

2. A continuous free-standing diamond film according to claim 1 where said chemical vapor deposition is hot filament chemical vapor deposition or microwave plasma assisted chemical vapor deposition.

3. A continuous free-standing diamond film according to claim 2 where the microwave plasma assisted chemical vapor deposition diamond growth rate for diamond layer A is 3–5 microns per hour, and the growth rate for diamond layer B is 1.0–2.0 microns per hour.

4. A continuous free-standing diamond film according to claim 1 where the thermal conductivity layers A and B are deposited in any sequence provided there is at least one diamond layer A and one diamond layer B in the continuous free-standing diamond film.

5. A continuous free-standing diamond film according to claim 1 where the substrate temperature for layer A is between 900°–960° C. and the substrate temperature for layer B is about 800° C.

* * * * *